United States Patent
Alpert et al.

(10) Patent No.: US 7,895,557 B2
(45) Date of Patent: Feb. 22, 2011

(54) CONCURRENT BUFFERING AND LAYER ASSIGNMENT IN INTEGRATED CIRCUIT LAYOUT

(75) Inventors: Charles J. Alpert, Cedar Park, TX (US); Zhuo Li, Cedar Park, TX (US); Tuhin Mahmud, Austin, TX (US); Stephen T. Quay, Austin, TX (US); Paul G. Villarrubla, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 12/100,477

(22) Filed: Apr. 10, 2008

(65) Prior Publication Data
US 2009/0259980 A1    Oct. 15, 2009

(51) Int. Cl.
G06F 17/50    (2006.01)
G06F 9/455    (2006.01)

(52) U.S. Cl. .............. 716/114; 716/108; 716/119; 716/126

(58) Field of Classification Search .......... 716/6, 716/9, 10, 108, 114, 119, 126
See application file for complete search history.

(56) References Cited

U.S. PATENT DOCUMENTS

| | | | | |
|---|---|---|---|---|
| 6,367,060 B1 * | 4/2002 | Cheng et al. | ......... | 716/10 |
| 6,438,733 B1 * | 8/2002 | Clement | ......... | 716/4 |
| 7,028,280 B1 * | 4/2006 | Liu et al. | ......... | 716/8 |
| 7,269,815 B2 * | 9/2007 | Wein et al. | ......... | 716/18 |
| 7,356,785 B2 * | 4/2008 | Lu et al. | ......... | 716/2 |
| 2004/0225984 A1 * | 11/2004 | Tsao et al. | ......... | 716/10 |
| 2009/0007039 A1 * | 1/2009 | Kauth et al. | ......... | 716/5 |

* cited by examiner

*Primary Examiner*—Thuan Do
*Assistant Examiner*—Magid Y Dimyan
(74) *Attorney, Agent, or Firm*—Dillon & Yudell LLP

(57) ABSTRACT

A method and system for concurrent buffering and layer assignment in integrated current layout. Buffers are inserted and metal interconnects or "wires" are sized for every net, which consists of one driver and one or more receivers, such that timing skew constraints can be met. Long nets are promoted to a higher level if the slew violation can be fixed only by a promotion of the net or if the "slack" gain available by this promotion is equal to or greater than a predesignated layer of promotion threshold. In response to determining these layer assignments, the method and system then systematically demotes nets that are not critical and which do not impact the circuit and electrical constraints in order to minimize the use of high layer wire resources.

2 Claims, 4 Drawing Sheets

CONCURRENT BUFFERING AND LAYER ASSIGNMENT IN INTEGRATED CIRCUIT LAYOUT

BACKGROUND OF THE INVENTION

1. Technical Field

The present invention relates to automated digital logic synthesis and more specifically it is directed to an improved integrated circuit design method for performing concurrent buffer insertion and layer assignment within an integrated circuit design to achieve optimal timing while maintaining speed and efficient use of resources.

2. Description of the Related Art

The present invention has particular application in the computer aided design of integrated circuits utilizing nanometer technology where increased resistivity due to finer metal layer widths and longer interconnect delays are a concern. Buffer or repeater insertion is a popular technique to reduce such interconnect delay. The number of block-level nets requiring buffer insertion rises as process technology scales down and a larger number of buffers are required to meet interconnect timing requirements for specific circuit designs. These additional buffers occupy a lot of active silicon and routing area and a rapid increase in the number of buffers can yield designs which are not feasible. The reduction in metal layer width increases the resistance of the interconnect wires which may be compensated for utilizing vertical scaling and additional metal layers. For example, in 65 nm technologies, there may be three metal layer horizontal/vertical pairs available for logic and physical synthesis. The upper metal layers are less resistive as a result of increased geometries and inter-buffer separation may be much larger, reducing the need for additional buffers.

As a result, techniques for metal layer assignment and buffering are increasingly important for optimal wire and buffer synthesis which can meet electrical and timing constraints of a VLSI silicon design. These techniques are utilized several times during the design process and consequently, the use of a fast reliable algorithm is critical.

SUMMARY OF THE INVENTION

In accordance with the present invention, buffers are inserted and metal interconnects or "wires" are sized for every net, which consists of one driver and one or more receivers, such that timing skew constraints can be met. This method promotes long nets to a higher level if the slew violation can be fixed only by a promotion of the net or if the "slack" gain available by this promotion is equal to or greater than a layer of promotion threshold which has been selected by the circuit designer. "Slack" is the minimum difference between required arrival time and the path delay between a driver and each receiver driven by that driver. In response to determining these layer assignments, the system then systematically demotes nets that are not critical and which do not impact the circuit and electrical constraints in order to minimize the use of high layer wire resources.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF ILLUSTRATIVE EMBODIMENT

In the description below it is understood that each block in a logic flowchart illustration and combination of blocks in the flowchart illustration may be implemented as computer program instructions within the computer depicted in FIG. 4.

It is further understood that the use of a specific component, device and/or parameter names are for example only and are not meant to imply any limitations on the invention. The invention may be implemented with different nomenclature terminology which is utilized to describe the components, devices and parameters herein without limitation. Each term utilized herein is to be given its broadest interpretation in the context in which that term has been utilized.

The present invention provides an effective synthesis flow and methods that integrate buffering and layer assignment to fix electrical violations in an integrated circuit design by performing concurrent buffering and layer assignment to fix electrical violations, achieve optimal timing and provide high metal level wire resource utilization.

The method and system of the present invention will be described in detail below; however, a high level view of the process may be useful for understanding the present invention. Initially, the integrated circuit designer provides input parameters specifying the required circuitry for the integrated circuit. Thereafter, a buffer insertion process takes place in order to ensure that required signals arrive at the appropriate time.

Next, for each logic net, which consists of a signal driver and one or more receivers, the following steps are performed. Design parameters are specified by the integrated circuit designer. Thereafter, buffers are inserted to achieve required signal arrival times. A layer assignment is initially chosen for the slew recovery process. Next, a layer assignment is performed for the delay improvement process if additional cost optimization and performance improvements are required. Finally, upon completion of the layer assignment for delay improvement selected nets may be selectively demoted to a lower layer if the resulting slack degradation is acceptable and does not cause electrical violations. This process is repeated until each logic net within the integrated circuit has been processed.

Figure 1:
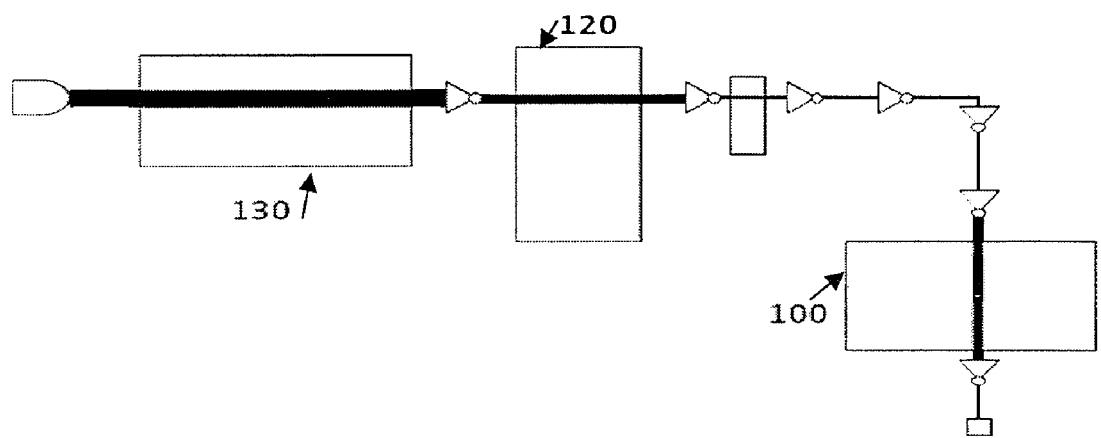
FIG. 1 is an exemplary pictorial representation which depicts a portion of an integrated circuit with buffer insertions and layer promotion in order to meet slew requirements in accordance with the method and system of the present invention.

With reference now to the figures, and with reference to FIG. 1, there is depicted an exemplary pictorial representation illustrating a portion of an integrated circuit with buffer insertions and layer promotions which have been accomplished in order to meet slew requirements. Within FIG. 1, certain regions 100, 120 and 130 are designated as obstacle blocks or areas of existing circuitry which must be bypassed and can not support the insertion of additional buffers. Thus, for example, it may be noted that the signal must traverse obstacle block 130, obstacle block 120 and obstacle block 100, in addition to one or more small obstacle blocks which are not illustrated. Buffer insertion may be accomplished outside of these obstacle blocks; however, requirements for signal transmission may require promotion of the signal to a higher layer of metal interconnect having lower resistivity and consequently faster signal propagation. As illustrated within FIG. 1, metal interconnects at higher levels having lower resistivity are depicted as thicker lines.

Thus, in accordance with the example depicted in FIG. 1, in order to traverse obstacle block 130 in the appropriate amount of time, it is necessary to promote the signal transmission to a higher level of metal interconnect having greater thickness and less resistivity. A buffer may be inserted between obstacle block 130 and obstacle block 120; however, in order to traverse obstacle block 120 in sufficient time it is necessary to promote the signal to an intermediate layer of metal interconnect having less resistivity than the more complex lower level of interconnect.

Thereafter, it may be seen that the signal can be transmitted over the lower level of metal interconnect, depicted within FIG. 1 as having narrow dimension, until such time as the signal must traverse obstacle block 100. At that point, it is once again necessary to utilize a higher level interconnect having less resistivity in order to traverse obstacle block 100 in the requisite amount of time.

Figure 2:
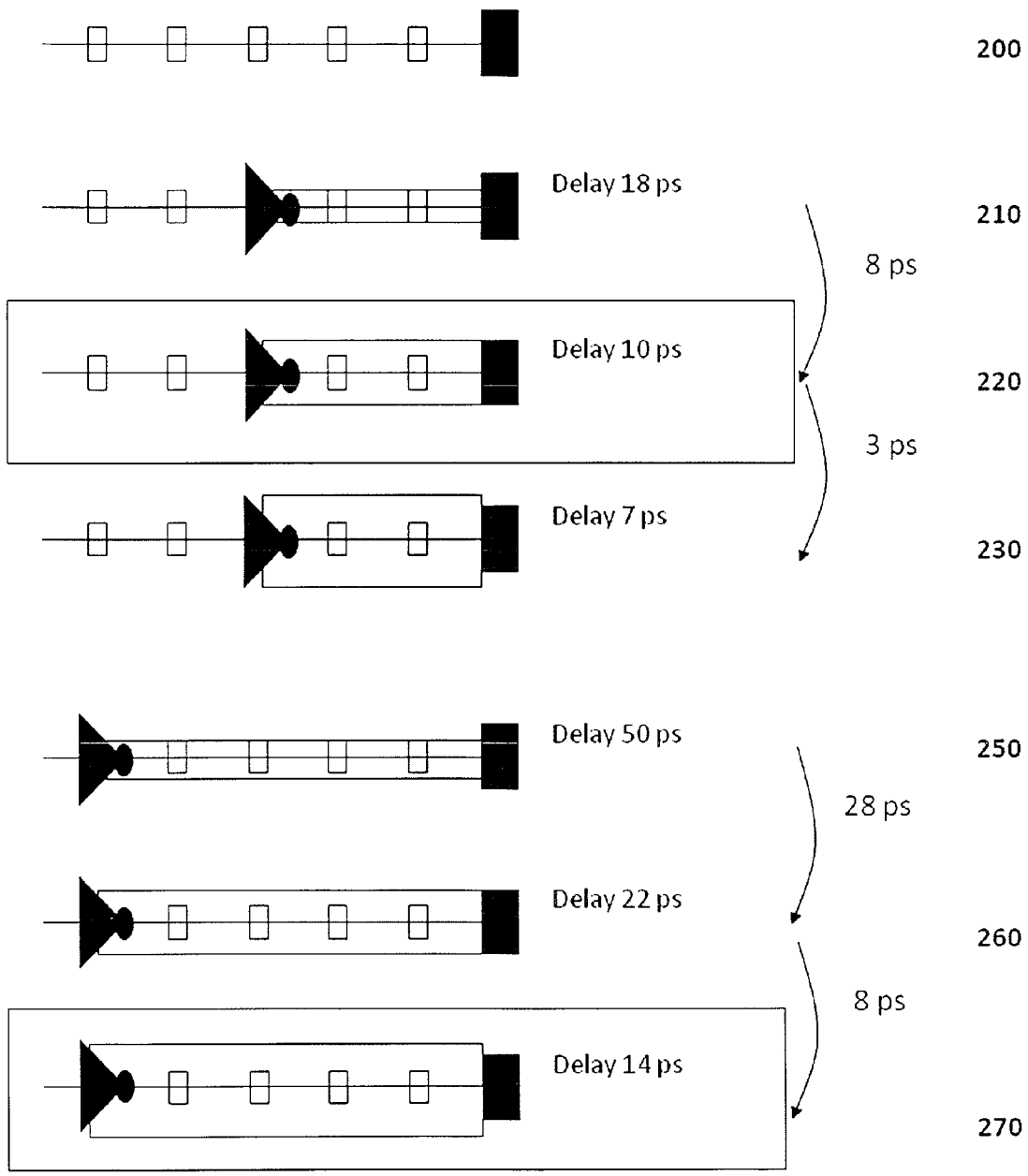
FIG. 2 is an exemplary pictorial representation of tentative buffer insertion points and slack gain by layer promotion in accordance with the method and system of the present invention.

Referring now to FIG. 2, there is depicted an exemplary pictorial representation of tentative buffer insertion points and the "slack" gain obtained by a layer of promotion in accordance with the method and system of the present invention. As illustrated within FIG. 2, the integrated circuit designer has set as the layer promotion threshold a transmission time of 5 pico-seconds. As illustrated at reference numeral 210, the delay in transmission through the depicted net is 18 of pico-seconds. Promotion of that net to a higher level of metal interconnect yields a new signal delay of 10 pico-seconds and thus a "slack" gain of 8 pico-seconds is provided, which is larger than the specified layer of promotion threshold of 5 pico-seconds. As illustrated, promotion of this net to a next higher level of metal interconnect, as depicted at reference numeral 230, results in a delay of only 7 pico-seconds; however, the 3 pico-second gain is less than the layer promotion threshold of 5 pico-seconds specified by the integrated circuit designer and consequently, this promotion will not occur, as the gain does not justify the utilization of higher level resources.

The second example depicted within FIG. 2 begins at reference numeral 250 which depicts a long net having a delay of 50 pico-seconds. Promoting that net to a higher level of interconnect decreases the delay to 22 pico-seconds, a savings of 28 pico-seconds. This savings is greater than the layer of promotion threshold of 5 pico-seconds specified by the designer and consequently, this promotion is approved. Additionally, promoting this net to the next higher level of interconnect, as depicted at reference number 270, decreases the delay to 14 pico-seconds, a savings of 8 pico-seconds. As this savings is once again greater than the layer of promotion threshold of 5 pico-seconds specified by the designer, this promotion is also approved.

Consequently, with reference to FIG. 2, those having ordinary skill in the art will appreciate by specifying a lower layer promotion threshold and thereafter testing the decrease in signal arrival time available as a result of promotion, a logical and efficient technique for promoting certain signal paths to a higher level of interconnect may be obtained.

Figure 3:
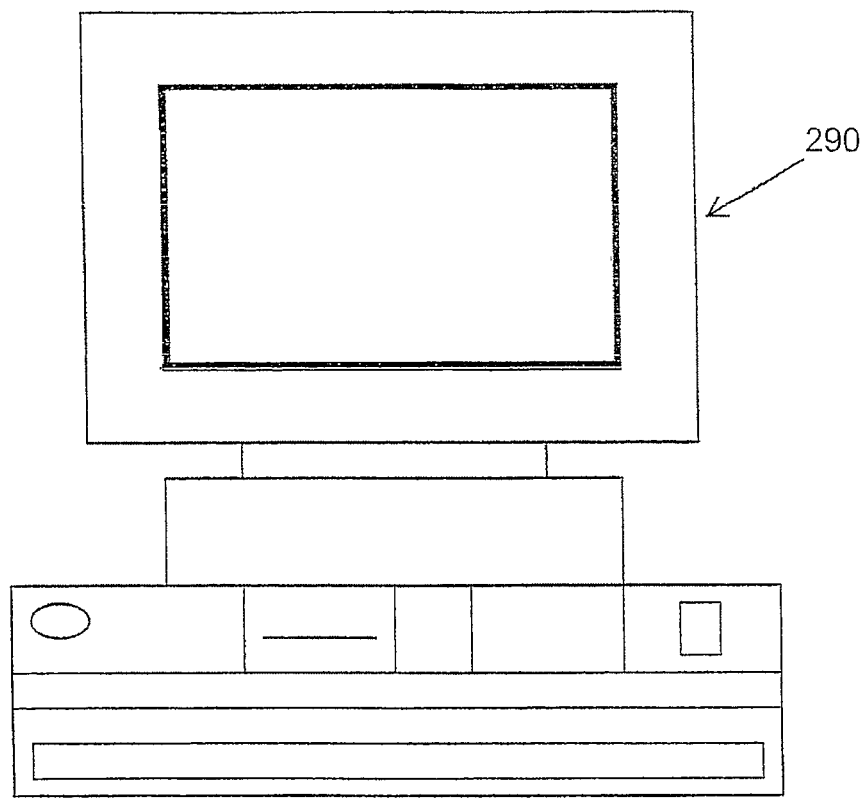
FIG. 3 is a pictorial representation of a computer which may be utilized to implement the method and system of the present invention.

With reference now to FIG. 3, there is depicted a pictorial representation of a computer which may be utilized to implement the method and system of the present invention. As illustrated, computer 290 may comprise any suitable programmed computing platform as a means capable of performing the process describe below with respect to FIG. 4, and capable of performing the testing associated with that process.

Figure 4:
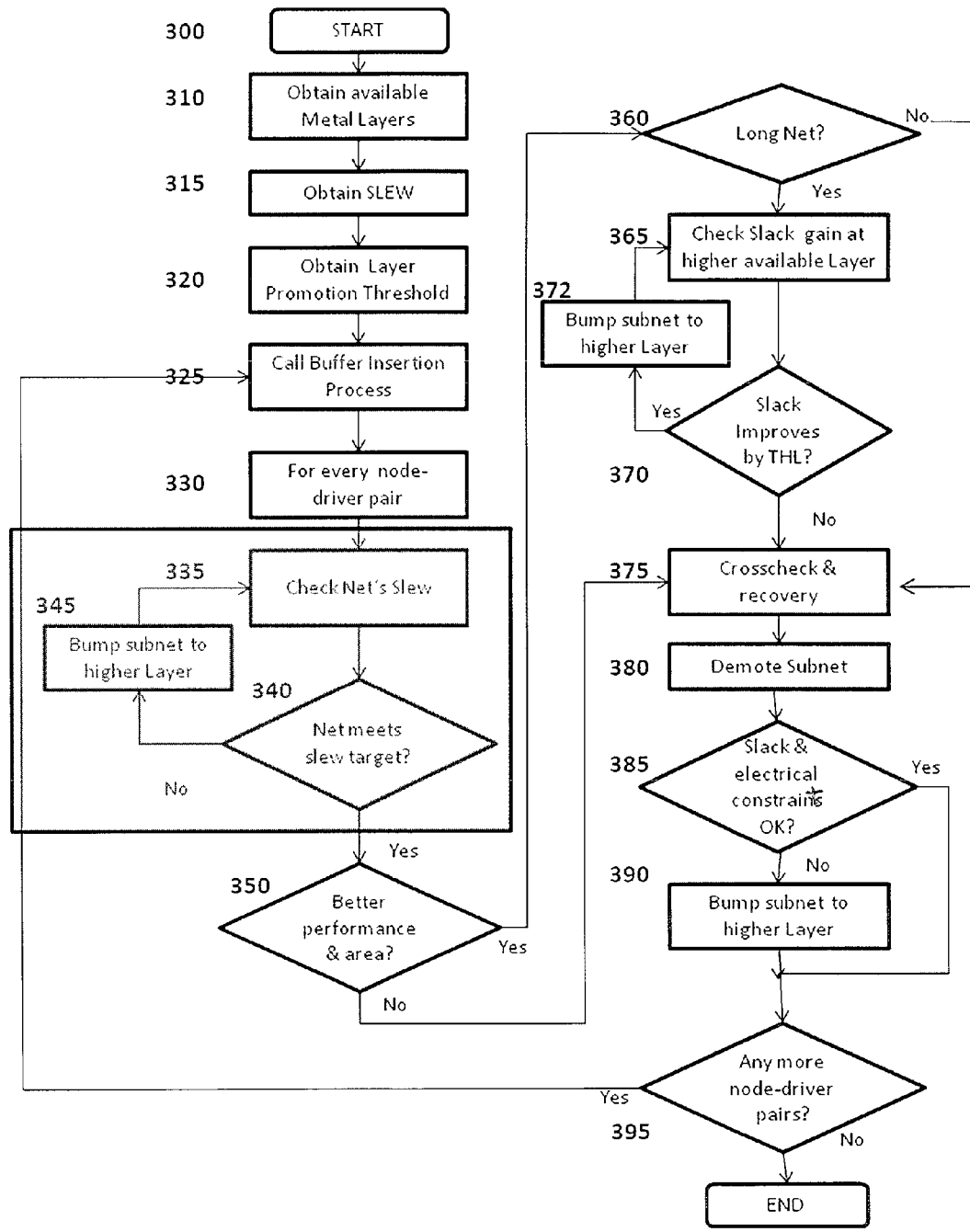
FIG. 4 depicts a high level logic flow chart of an exemplary method for performing concurrent buffering and layer assignment in order to achieve optimal timing while maintaining speed and efficient use of resources in accordance with the method and system of the present invention.

With reference now to FIG. 4, there is illustrated a logic flowchart which depicts a method for concurrent buffering and layer assignment in an integrated circuit design which may be utilized in order to achieve optimal timing while maintaining speed and efficient use of resources in accordance with the present invention.

As depicted, the process begins at block 300 and thereafter proceeds unto block 310. Block 310 illustrates the obtaining of the available metal layer or interconnects within the integrated circuit and the specifications associated with those available metal layers. Next, the process passes to block 315. Block 315 illustrates the obtaining of the required slew, or the time at which a signal must arrive.

Block 320 illustrates the obtaining of the layer promotion threshold. As noted above, the layer promotion threshold is a threshold specified by the designer of the integrated circuit. A promotion of a net to a higher level must result in a decrease in slew which is greater than the layer promotion threshold, as described above, or the promotion will not be permitted.

Next, as illustrated at block 325, the buffer insertion process is called. This buffer insertion process is described above with respect to FIG. 1, and illustrates the insertion of buffers necessary to meet the slew design constraints for the integrated circuit.

Next, for every node/driver pair, as illustrated at block 330, the system performs the Layer Assignment for Slew Recovery process. This process begin at block 355 wherein each node/driver pair is checked to determine the slew or time delay between transmission of a signal by the driver and receipt of that signal at each receiver connected to that driver. The process then passes to block 340. Block 340 illustrates a determination of whether or not the slew for each driver/receiver pair meets the specified target, and if not, the process passes to block 345. Block 345 illustrates the reassignment of at least a portion of that net to a higher interconnect level and the process then returns in an iterative fashion to block 335 where the slew for that particular portion is once again determined. Once the slew has been determined and has met the target for each node/driver pair, the process passes to block 350.

Block 350 illustrates a determination of whether or not the current layout of each node/driver pair optimally satisfies performance and area constraints. If better performance and area utilization can be obtained, the process passes to block 360 which depicts the performance of the Layer Assignment for Delay Improvement process. Therefore, as depicted at block 360, in the event the node/driver pair comprises a "long net" the process passes to block 365. Block 365 illustrates the making of a determination as to whether or not sufficient "slack" can be gained by promoting the long net to a higher available layer. If the node/driver pair does not comprise a long net, the process passes to block 375 as will be described below.

Next, as illustrated at block 370, a determination is made as to whether or not the "slack" gain available from a move to a higher available layer has improved by an amount equal to or greater than the layer promotion threshold value specified by the designer. If so, the process passes to block 372 which illustrates the promotion of that subnet to a higher level of interconnect and the process then returns to block 365, in an iterative fashion. Once the "slack" gain reaches the point where it can no longer be improved by an amount greater than or equal to the layer promotion threshold value specified by the designer, the process passes to block 375.

Next, in the event better performance and area utilization can not be obtained, as determined at block 350 or after all available higher interconnect promotion has been obtained, the process passes to block 375. Block 375 is the start of the demote safety and recovery process which is utilized to validate the effective use of resources.

This process next passes unto block 380 which illustrates the demotion of a subnet to a lower electrical connection layer and the process then passes to block 385. Block 385 illustrates a determination of whether or not the "slack" and electrical constraints are still satisfactory and if so, the process passes to block 395 to process any additional node/driver pairs. In the event the "slack" and electrical constraints no longer meet the required values, the process passes to block 390 which illustrate the promotion of that subnet back to a higher level. Thereafter, as illustrated, the process passes to block 395 for a determination of whether or not any additional node/driver pairs must be processed. In the event there are additional node/driver pairs, the process returns, in an iterative fashion, to block 325 and proceeds as described above. In the event all node/driver pairs have been processed, the process ends as depicted.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method in a data processing system for assigning buffer and layer positions within a multi-level integrated circuit design layout, said method comprising:

for every driver and all receivers having an interconnection therewith:
  the data processing system inserting sufficient buffers within said interconnection to obtain a required signal arrival time;
  where sufficient buffers can not be inserted, the data processing system promoting at least a portion of said interconnection to a higher level within said multi-level integrated circuit design;
  the data processing system additionally promoting each portion of said interconnection to a higher level within said multi-level integrated circuit design so long as each promotion results in a signal arrival time savings which exceeds 5 picoseconds; and
thereafter, for every driver and all receivers having an interconnection there between:
  the data processing system selectively demoting each interconnection between a driver and a receiver to a lower level only if said required signal arrival time can still be satisfied.

2. A system for assigning buffer and layer positions within a multi-level integrated circuit design layout, said system comprising:
  means for inserting sufficient buffers within each interconnection for every driver and all receivers having an interconnection therewith to obtain a required signal arrival time;
  means for promoting at least a portion of said interconnection to a higher level within said multi-level integrated circuit design where sufficient buffers can not be inserted;
  means for additionally promoting each portion of said interconnection to a higher level within said multi-level integrated circuit design so long as each promotion results in a signal arrival time savings which exceeds 5 picoseconds; and
  means for thereafter selectively demoting each interconnection between a driver and a receiver to a lower level only if said required signal arrival time can still be satisfied.

* * * * *